(12) United States Patent
Hong

(10) Patent No.: US 11,943,888 B2
(45) Date of Patent: Mar. 26, 2024

(54) WIRING MEMBER HAVING BENDING PROPERTY AND ELECTRONIC DEVICE COMPRISING SAME

(71) Applicant: Samsung Electronics Co., Ltd., Gyeonggi-do (KR)

(72) Inventor: Eunseok Hong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 405 days.

(21) Appl. No.: 17/287,334

(22) PCT Filed: Oct. 28, 2019

(86) PCT No.: PCT/KR2019/014300
§ 371 (c)(1),
(2) Date: Apr. 21, 2021

(87) PCT Pub. No.: WO2020/091354
PCT Pub. Date: May 7, 2020

(65) Prior Publication Data
US 2021/0360814 A1 Nov. 18, 2021

(30) Foreign Application Priority Data
Oct. 29, 2018 (KR) .................. 10-2018-0130103

(51) Int. Cl.
*H05K 1/02* (2006.01)
*H05K 1/03* (2006.01)
(Continued)

(52) U.S. Cl.
CPC ......... *H05K 7/1427* (2013.01); *H05K 1/0277* (2013.01); *H05K 1/0353* (2013.01);
(Continued)

(58) Field of Classification Search
CPC ...... H05K 1/0277; H05K 1/0353; H05K 1/09; H05K 7/1427; H05K 5/0226
See application file for complete search history.

(56) References Cited

U.S. PATENT DOCUMENTS

2008/0062658 A1* 3/2008 Oowaki ................. H05K 1/028
361/749
2009/0104949 A1* 4/2009 Sato .................... H04M 1/0214
439/449
(Continued)

FOREIGN PATENT DOCUMENTS

| JP | 07122856 | 5/1995 |
|---|---|---|
| JP | 2000332416 | 11/2000 |

(Continued)

OTHER PUBLICATIONS

PCT/ISA/210 Search Report issued on PCT/KR2019/014300, dated Jan. 30, 2020, pp. 5.
(Continued)

*Primary Examiner* — Hoa C Nguyen
(74) *Attorney, Agent, or Firm* — The Farrell Law Firm, P.C.

(57) ABSTRACT

An electronic device according to various embodiments of the present invention may comprise: a first housing; a hinge part having a first surface connected to the first housing; a second housing connected to a second surface of the hinge part opposite to the first surface; and a wiring member for electrically connecting the first housing and the second housing. The wiring member may be folded or unfolded on the basis of the hinge part, and a slit may be formed to correspond to at least a portion of the folded or unfolded bending area. In addition, other embodiments are possible.

14 Claims, 12 Drawing Sheets

(51) Int. Cl.
  *H05K 1/09* (2006.01)
  *H05K 5/02* (2006.01)
  *H05K 7/14* (2006.01)
(52) U.S. Cl.
  CPC ............ *H05K 1/09* (2013.01); *H05K 5/0226* (2013.01); *H05K 2201/0154* (2013.01)

(56) References Cited

U.S. PATENT DOCUMENTS

| | | | | |
|---|---|---|---|---|
| 2012/0092837 | A1* | 4/2012 | Tanaka | H05K 1/0281 |
| | | | | 174/254 |
| 2012/0092838 | A1* | 4/2012 | Kitano | H05K 1/0215 |
| | | | | 174/254 |
| 2017/0060188 | A1 | 3/2017 | Han et al. | |
| 2019/0098775 | A1* | 3/2019 | Cho | H10K 50/86 |
| 2020/0323086 | A1* | 10/2020 | Tadano | H05K 5/0226 |

FOREIGN PATENT DOCUMENTS

| | | |
|---|---|---|
| JP | 2005251958 | 9/2005 |
| JP | 2008-065728 | 3/2008 |
| JP | 2013157490 | 8/2013 |
| KR | 1020160046605 | 4/2016 |
| KR | 1020160112121 | 9/2016 |
| KR | 1020170026021 | 3/2017 |

OTHER PUBLICATIONS

PCT/ISA/237 Written Opinion issued on PCT/KR2019/014300, dated Jan. 30, 2020, pp. 4.
Korean Office Action dated Oct. 20, 2023 issued in counterpart application No. 10-2018-0130103, 10 pages.

\* cited by examiner (a)  (b)

(a)

(b)

(c)

(a)

(b)

(c)

WIRING MEMBER HAVING BENDING PROPERTY AND ELECTRONIC DEVICE COMPRISING SAME

PRIORITY

This application is a National Phase Entry of PCT International Application No. PCT/KR2019/014300 which was filed on Oct. 28, 2019, and claims priority to Korean Patent Application No. 10-2018-0130103, which was filed on Oct. 29, 2018, the content of each of which is incorporated herein by reference.

TECHNICAL FIELD

Various embodiments of the disclosure relate to an electronic device including a wiring member having a bending property.

BACKGROUND ART

An electronic device may be a foldable electronic device, which may have a folding axis and a housing that can be folded or unfolded about the folding axis. For example, the electronic device may include a first housing located on a left side and a second housing located on a right side, based on the folding axis centered. The first and second housings may have a form divided based on the folding axis. At least one antenna and communication module may be mounted in the first and second housings, and electrical connection between the first and second housings may be made based on at least one wiring member (e.g., a radio frequency transmission line). Because the electronic device is capable of being folded or unfolded around the folding axis, the wiring member may be manufactured based on a material having a bending property.

DISCLOSURE OF INVENTION

Technical Problem

The electronic device corresponds to a foldable electronic device, and the first and second housings may be folded or unfolded with each other, based on the folding axis. At least one component included in the first housing and at least one component included in the second housing may be electrically connected to each other, based on a radio frequency transmission line (RF line). The RF line may be disposed across the folding axis and made to be bent. The RF line may have a bending property. The RF line requires durability to perform numerous bending operations.

According to various embodiments of the disclosure, the RF line has durability for performing numerous bending operations, and can transmit a signal without deterioration in performance caused by signal transmission.

Solution to Problem

An electronic device according to various embodiments of the disclosure may include a first housing, a hinge part having a first surface connected to the first housing, a second housing connected to a second surface of the hinge part opposite to the first surface, and a wiring member electrically connecting the first housing and the second housing. The wiring member may be folded or unfolded based on the hinge part, and may have a slit formed to correspond to at least a portion of the folded or unfolded bending area.

A bendable wiring member according to various embodiments of the disclosure may include a first substrate, and a second substrate stacked on a first surface of the first substrate. At least one radio frequency transmission line may be formed based on the first substrate, and a first slit may be formed in the second substrate to correspond to at least a portion of a bending area in which the wiring member is folded or unfolded.

Advantageous Effects of Invention

An electronic device according to various embodiments of the disclosure may include a foldable electronic device, and a wiring member having a bending property may be disposed corresponding to a bending area. The wiring member may include a radio frequency transmission line, and may transmit a signal through the radio frequency transmission line without deterioration in performance caused by signal transmission. The radio frequency transmission line may be formed of a material having a bending property. The radio frequency transmission line may have a slit structure to have durability against a bending operation. The radio frequency transmission line can maintain signal transmission performance even if the thickness is reduced due to the slit structure.

In an electronic device according to various embodiments of the disclosure, a radio frequency transmission line has durability for performing bending operations, and can transmit a signal without deterioration in performance caused by signal transmission.

MODE FOR THE INVENTION

Figure 1:
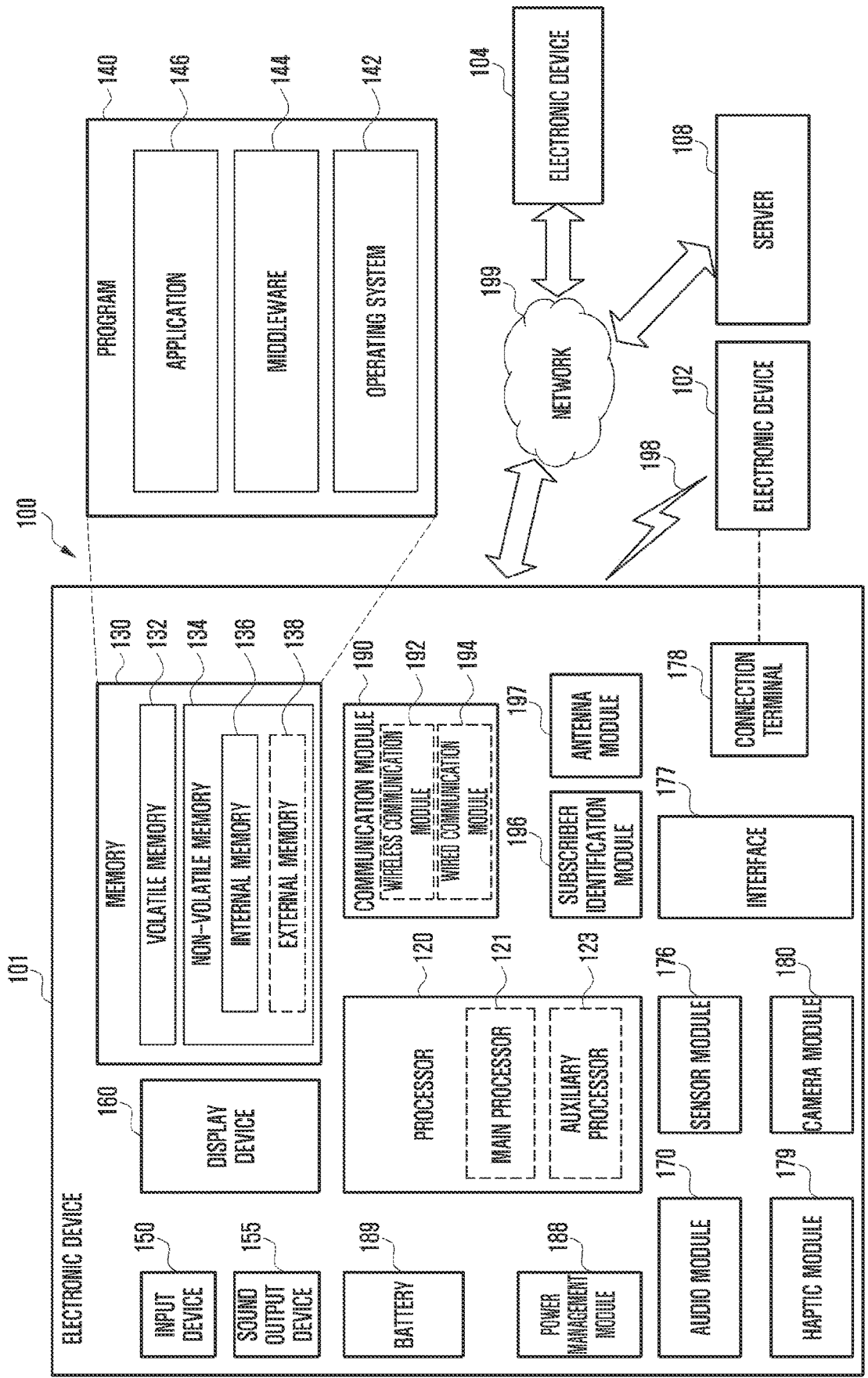
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 (e.g., DRAM, SRAM, or SDRAM) or the non-volatile memory 134.

The program 140 may be stored in the memory 130 as software, and may include, for example, an operating system (OS) 142, middleware 144, or an application 146 (e.g., application program).

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation.

According to an embodiment, the haptic module 179 may include, for example, a motor, a piezoelectric element, or an electric stimulator.

The camera module 180 may capture a still image or moving images.

According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)).

These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
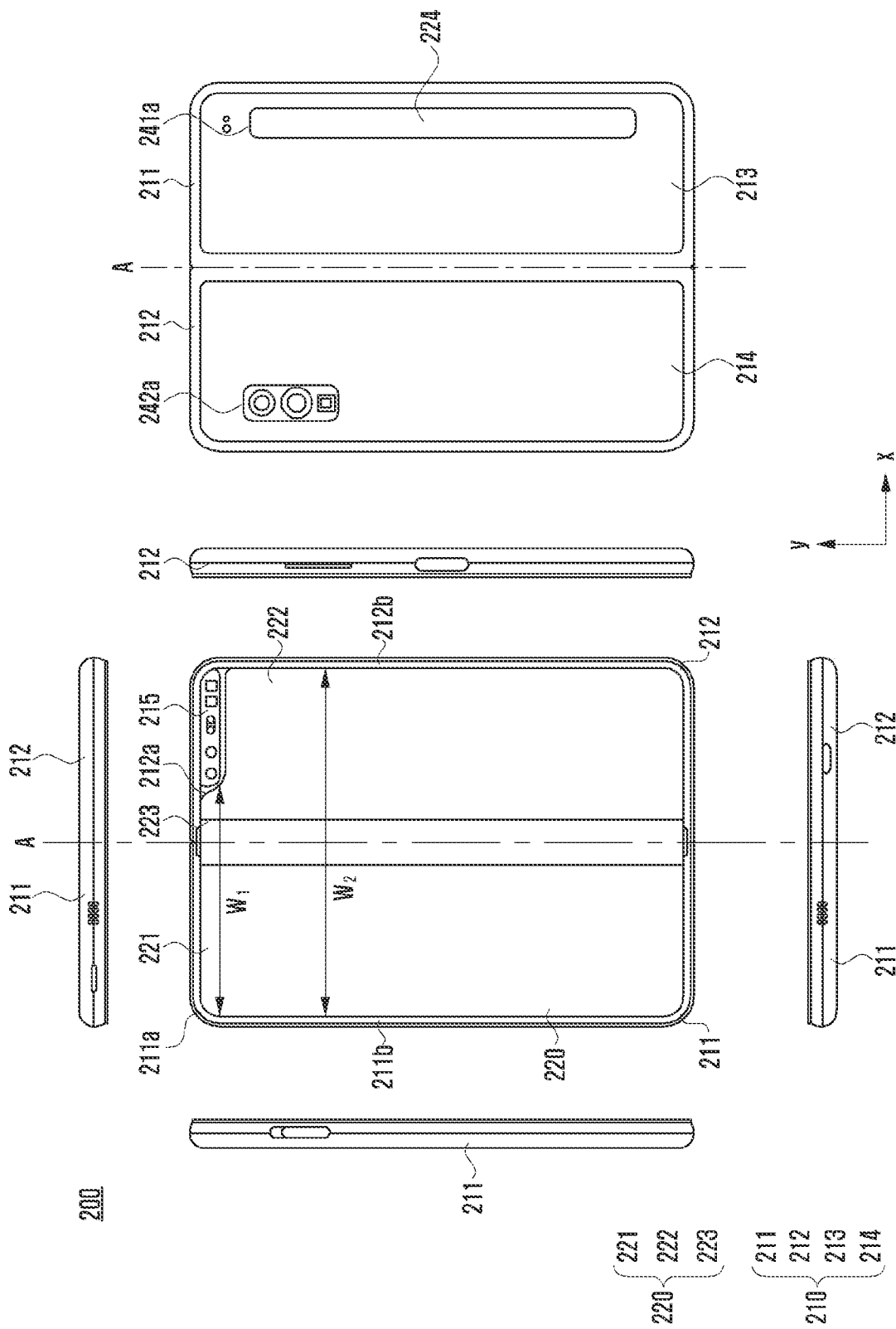
FIG. 2A is a view illustrating an unfolded state of an electronic device according to various embodiments.
Figure 2B:
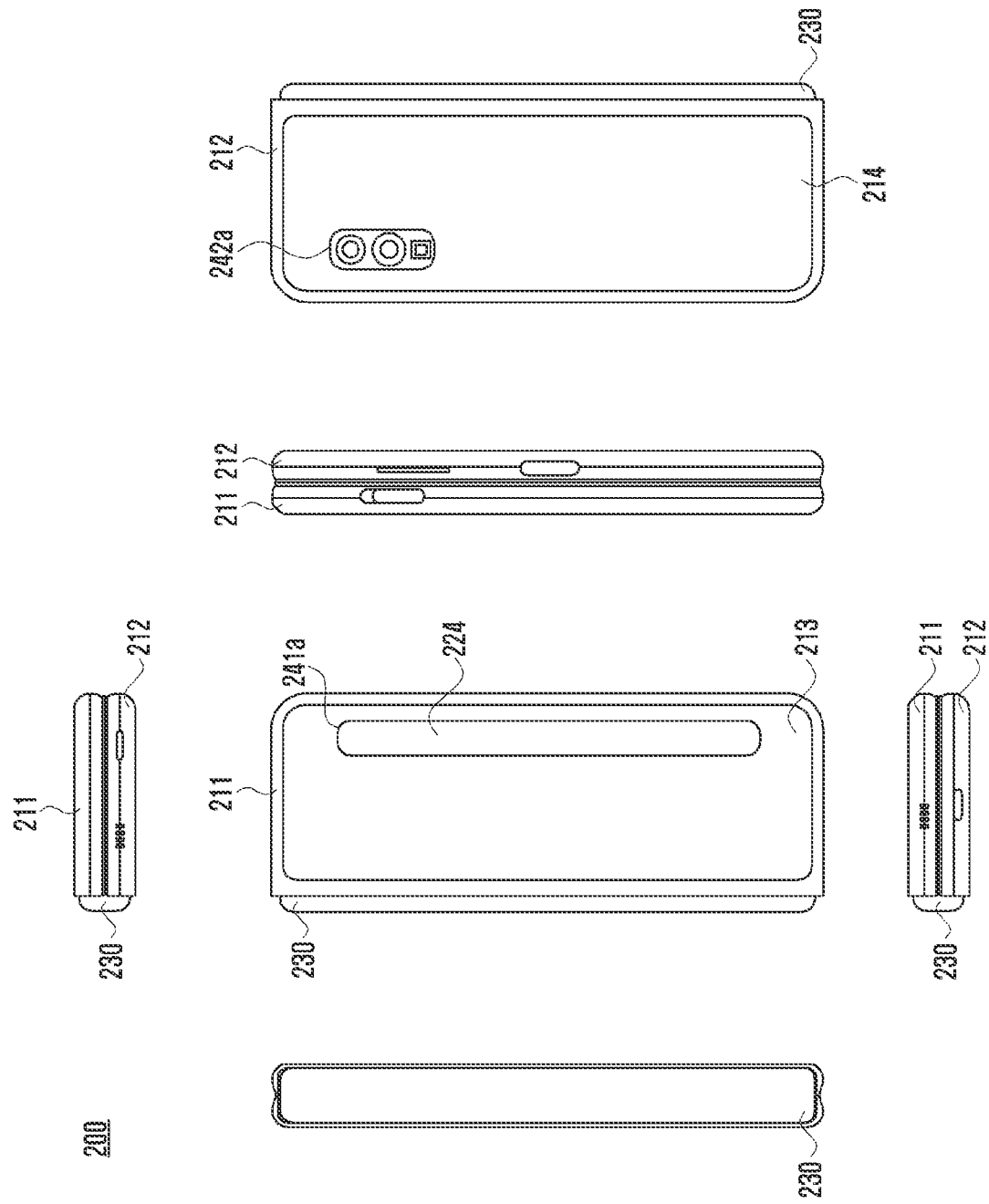
FIG. 2B is a view illustrating a folded state of the electronic device shown in FIG. 2A.
Figure 2C:
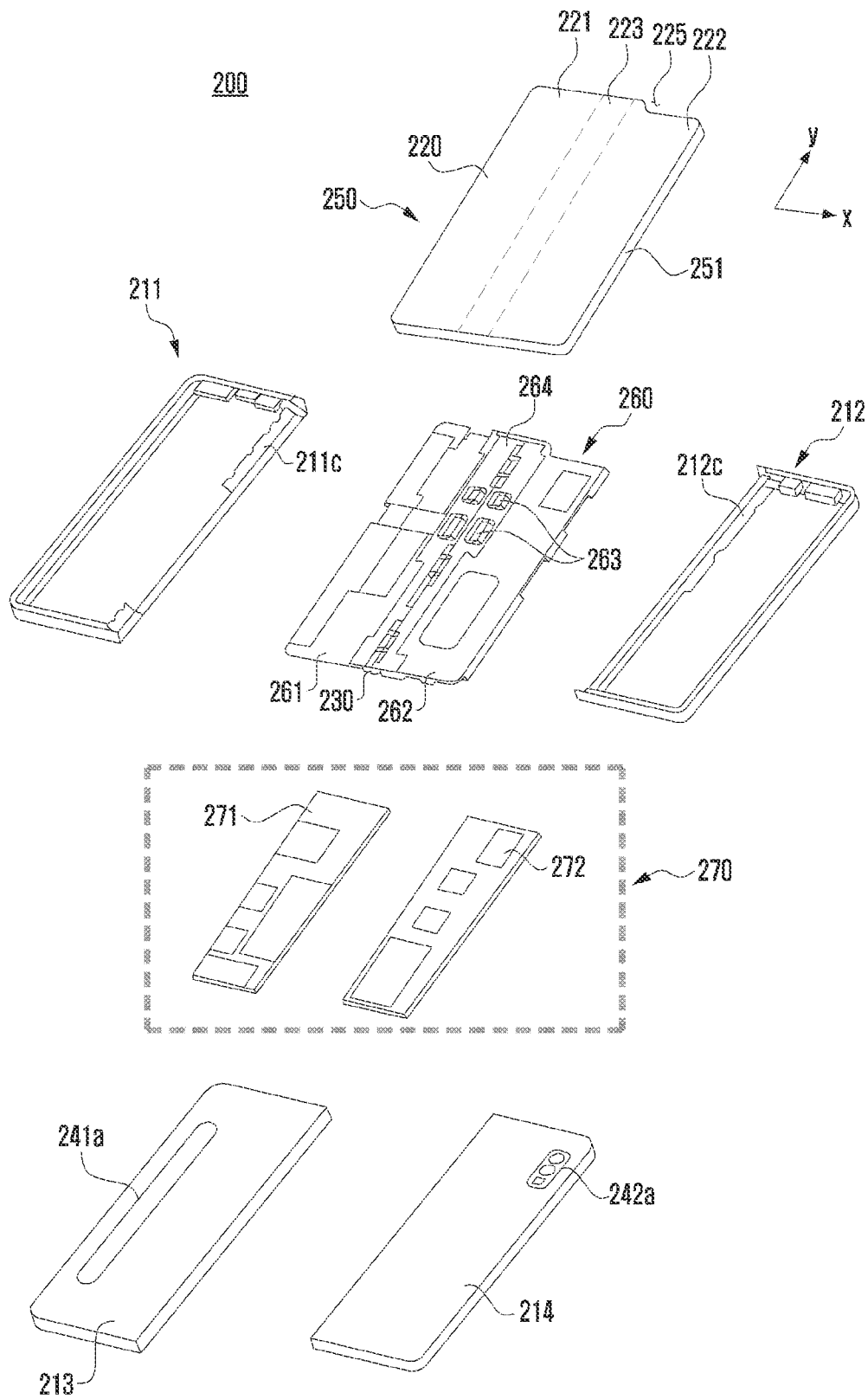
FIG. 2C is an exploded perspective view of the electronic device shown in FIG. 2A.

FIG. 2A is a view of the electronic device 200 in the unfolded state according to various embodiments of the disclosure. FIG. 2B is a view of the electronic device 200 in the folded state according to various embodiments of the disclosure. FIG. 2C is an exploded perspective view of the electronic device 200 according to various embodiments of the disclosure.

With reference to FIG. 2A, 2B, 2C, the electronic device 200 (e.g., electronic device 101 in FIG. 1) may include a foldable housing 210, a hinge cover 230 covering the foldable portion of the foldable housing 210, and a display 220 (e.g., flexible display or foldable display) (e.g., display device 160 in FIG. 1) disposed in the space formed by the foldable housing 210. In the description, the surface on which the display 220 is disposed may be referred to as the front surface of the electronic device 200, and the opposite side of the front surface may be referred to as the rear surface of the electronic device 200. The surface surrounding the space between the front surface and the rear surface may be referred to as the side surface of the electronic device 200.

In one embodiment, the foldable housing 210 may include a first housing structure 211, a second housing structure 212 including a sensor region 215, a first rear cover 213, and a second rear cover 214. The foldable housing 210 the electronic device 200 are not limited to the shape or combination shown in FIGS. 2A and 2B, but may be implemented in various shapes or combinations. For example, in another embodiment, the first housing structure 211 and the first rear cover 213 may be formed as a single body, and the second housing structure 212 and the second rear cover 214 may be formed as a single body.

In one embodiment, the first housing structure 211 and the second housing structure 212 may be disposed at both sides with respect to the folding axis (A) and may be substantially symmetrical with respect to the folding axis (A). In one embodiment, the angle or distance between the first housing structure 211 and the second housing structure 212 may vary depending upon whether the electronic device 200 is in the flat state or closed state, the folded state, or the intermediate state. In one embodiment, the second housing structure 212 includes the sensor region 215 where various sensors (e.g., sensor module 176 in FIG. 1) are disposed, but may have a symmetrical shape with the first housing structure 211 in other regions.

In one embodiment, the electronic device 200 may include a recess formed to accommodate the display 220 through a structural combination of the shapes of the first housing structure 211 and the second housing structure 212. In one embodiment, the recess may have two or more different widths in a direction perpendicular to the folding axis (A) due to the sensor region 215.

For example, the recess may have a first width (W1) between a first portion 211*a* of the first housing structure 211 parallel to the folding axis (A) and a first portion 212*a* of the second housing structure 212 formed at the edge of the sensor region 215, and have a second width (W2) between a second portion 211*b* of the first housing structure 211 and a second portion 211*b* of the second housing structure 212 that does not correspond to the sensor region 215 and is parallel to the folding axis (A). Here, the second width (W2) may be wider than the first width (W1). In other words, the recess may be formed to have the first width (W1) ranging from the first portion 211*a* of the first housing structure 211 to the first portion 212*a* of the second housing structure 212 (asymmetric shape), and the second width (W2) ranging from the second portion 211*b* of the first housing structure 211 to the second portion 212*b* of the second housing structure 212 (symmetric shape). In one embodiment, the first portion 212*a* and the second portion 212*b* of the second housing structure 212 may be located at different distances from the folding axis (A). The width of the recess is not limited to the example shown above. In various embodiments, the recess may have two or more different widths owing to the shape of the sensor region 215 or the asymmetry of the first housing structure 211 or the second housing structure 212.

In one embodiment, at least a portion of the first housing structure 211 and the second housing structure 212 may be made of a metal or non-metal material having a rigidity value selected to support the display 232.

In one embodiment, the sensor region 215 may be formed to have a preset area near to one corner of the second housing structure 212. However, the arrangement, shape, or size of the sensor region 215 is not limited to the illustrated example. For example, in a certain embodiment, the sensor region 215 may be formed at another corner of the second housing structure 212 or in any region between the upper corner and the lower corner. In one embodiment, to perform various functions, the electronic device 200 may include components exposed to the front surface of the electronic device 200 through the sensor region 215 or through one or more openings provided in the sensor region 215. The components may include, for example, at least one of a front camera, a receiver, a proximity sensor, an illuminance sensor, an iris recognition sensor, an ultrasonic sensor, or an indicator.

In one embodiment, the first rear cover 213 may be disposed on the rear surface of the electronic device 200 and may have a substantially rectangular periphery. In one embodiment, at least a portion of the periphery may be wrapped by the first housing structure 211. Similarly, the second rear cover 250 may be disposed on the rear surface of the electronic device 200, and at least a portion of the periphery thereof may be wrapped by the second housing structure 212.

In the illustrated embodiment, the first rear cover 213 and the second rear cover 214 may have a substantially symmetrical shape with respect to the folding axis (A). In another embodiment, the first rear cover 213 and the second rear cover 214 may have various different shapes. In another embodiment, the first rear cover 213 may be formed as a single body with the first housing structure 211, and the second rear cover 214 may be formed as a single body with the second housing structure 212.

In one embodiment, the first rear cover 213, the second rear cover 214, the first housing structure 211, and the second housing structure 212 may be combined with each other so as to provide a space where various components (e.g., printed circuit board, antenna module, sensor module, and battery) of the electronic device 200 can be arranged. In one embodiment, one or more components may be disposed on or visually exposed via the rear surface of the electronic device 200. For example, one or more components or sensors may be visually exposed through the first rear region 241a of the first rear cover 213. In another embodiment, one or more components or sensors may be visually exposed through the second rear region 251 of the second rear cover 250. Here, the sensors may include a proximity sensor, a rear camera, and/or a flash.

With reference to FIG. 2B, the hinge cover 230 may be disposed between the first housing structure 211 and the second housing structure 212 so as to cover the internal components (e.g., hinge structure 264 in FIG. 3). In one embodiment, the hinge cover 230 may be covered by portions of the first housing structure 211 and the second housing structure 212 or be exposed to the outside according to the operating state (e.g., flat state or folded state) of the electronic device 200.

For example, when the electronic device 200 is in the flat state as shown in FIG. 2A, the hinge cover 230 may be covered by the first housing structure 211 and the second housing structure 212 so as not to be exposed. When the electronic device 200 is in the folded state (e.g., completely folded state) as shown in FIG. 2B, the hinge cover 230 may be exposed to the outside between the first housing structure 211 and the second housing structure 212. When the electronic device 200 is in the intermediate state where the first housing structure 211 and the second housing structure 212 make a certain angle, the hinge cover 230 may be partially exposed to the outside between the first housing structure 211 and the second housing structure 212. In this case, the exposed portion may be less than that for the fully folded state. In one embodiment, the hinge cover 230 may include a curved surface.

The display 220 may be disposed on the space formed by the foldable housing 210. For example, the display 220 may be seated in the recess formed by the foldable housing 210, and may be disposed to substantially occupy most of the front surface of the electronic device 200.

Hence, the front surface of the electronic device 200 may include the display 220, a portion (e.g., edge region) of the first housing structure 211 close to the display 220, and a portion (e.g. edge region) of the second housing structure 212 close to the display 220. In one embodiment, the rear surface of the electronic device 200 may include the first rear cover 213, a portion (e.g., edge region) of the first housing structure 211 close to the first rear cover 213, the second rear cover 214, and a portion (e.g. edge region) of the second housing structure 212 close to the second rear cover 214.

In one embodiment, the display 220 may refer to a display whose at least a portion may be deformed into a flat or curved surface. In one embodiment, the display 220 may include a folding region 223, a first region 221 disposed on one side (e.g., right side of the folding region 223) with respect to the folding region 223, and a second region 222 disposed on the other side (e.g., left side of the folding region 223).

This demarcation of the display 220 is only an example, and the display 220 may be subdivided into plural regions (e.g., four or more regions) according to the structure or functionality. For example, in the embodiment of FIG. 2A, the area of the display 220 may be subdivided with respect to the folding area 223 or the folding axis (A) extending parallel to the y-axis. However, in another embodiment, the area of the display 220 may be subdivided with respect to a different folding region (e.g., folding region parallel to the x-axis) or a different folding axis (e.g., folding axis parallel to the x-axis).

In one embodiment, the first region 221 and the second region 222 may have a symmetrical shape with respect to the folding region 223. Although the second region 222 may include a notch region cut according to the presence of the sensor region 215, it may have a symmetrical shape with the first region 221 in other portions. In other words, the first region 221 and the second region 222 may include portions with symmetrical shapes and portions with asymmetrical shapes.

Next, a description is given of configurations of the first housing structure 211 and the second housing structure 212 and regions of the display 220 according to the operating state (e.g. flat state or folded state) of the electronic device 200.

In one embodiment, when the electronic device 200 is in the flat state (e.g., state of FIG. 2A), the first housing structure 211 and the second housing structure 212 may make an angle of 180 degrees, and the first region 221 and the second region 222 of the display 220 may be disposed to face in the same direction. In addition, the folding region 223 may be coplanar with the first region 221 and the second region 222.

In one embodiment, when the electronic device 200 is in the folded state (e.g., state of FIG. 2B), the first housing structure 211 and the second housing structure 212 may be disposed to face each other. The first region 221 and the second region 222 of the display 220 may face each other, making a narrow angle (e.g., between 0 degrees and 10 degrees). At least a portion of the folding area 223 may form a curved surface with a preset curvature.

In one embodiment, when the electronic device 200 is in the intermediate state, the first housing structure 211 and the second housing structure 212 may be disposed to make a certain angle. The first region 221 and the second region 222 of the display 220 may form an angle greater than that for the folded state and less than that for the flat state. At least a portion of the folding area 223 may form a curved surface with a preset curvature. This curvature may be less than that for the folded state.

With reference to FIG. 2C, in one embodiment, the electronic device 200 may include a display unit 250, a bracket assembly 260, printed circuit board 270, a first housing structure 211, a second housing structure 212, a first rear cover 213, and a second rear cover 214. In the description, the display 230 may be referred to as a display unit 250, display module, or display assembly.

The display unit 250 may include a display 220, and at least one plate 251 or layer on which the display 220 is seated. In one embodiment, the plate 251 may be disposed between the display 220 and the bracket assembly 260. The display 220 may be disposed on at least a portion of one surface (e.g., upper surface in FIG. 2C) of the plate 251. The plate 251 may be formed in a shape corresponding to the display 220. For example, a portion of the plate 251 may be formed in a shape corresponding to the notch region 225 of the display 220.

The bracket assembly 260 may include a first bracket 261, a second bracket 262, a hinge structure 264 disposed between the first bracket 261 and the second bracket 262, a hinge cover 230 to cover the hinge structure 264 when viewed from the outside, and a wiring member 263 (e.g., flexible printed circuit board (FPCB)) that crosses the first bracket 261 and the second bracket 262. According to various embodiments, the wiring member 263 may electrically connect at least one component disposed on the first bracket 261 and at least one component disposed on the second bracket 262. The wiring member 263 may be a transmission path for transmitting and receiving a signal between the first bracket 261 and the second bracket 262. For example, the wiring member 263 may be used for transmitting a signal between a first PCB disposed on the first bracket 261 and a second PCB disposed on the second bracket 262. For example, the wiring member 263 may be connected to the first PCB and the second PCB based on a connector. The wiring member 263 may include a radio frequency transmission line (hereinafter, may be referred to as an RF line), and the wiring member 263 may be formed of a member having a bending property.

In one embodiment, the bracket assembly 260 may be disposed between the plate 251 and the printed circuit board 270. For example, the first bracket 261 may be disposed between the first region 221 of the display 220 and the first printed circuit board 271. The second bracket 262 may be disposed between the second region 222 of the display 220 and the second printed circuit board 272.

In one embodiment, at least a portion of the wiring member 263 and the hinge structure 264 may be disposed within the bracket assembly 260. The wiring member 263 may be disposed in a direction crossing the first bracket 261 and the second bracket 262 (e.g., x-axis direction). The wiring member 263 may be disposed in a direction (e.g., x-axis direction) perpendicular to the folding axis (e.g., y-axis or folding axis (A) in FIG. 2) of the folding region 223.

The printed circuit board 270 may include, as described above, the first printed circuit board 271 disposed on the side of the first bracket 261, and the second printed circuit board 272 disposed on the side of the second bracket 262. The first printed circuit board 271 and the second printed circuit board 272 may be disposed inside the space formed by the bracket assembly 260, the first housing structure 211, the second housing structure 212, the first rear cover 213, and the second rear cover 214. Various components for implementing functions of the electronic device 200 may be mounted on the first printed circuit board 271 and the second printed circuit board 272.

In one embodiment, in a state where the display unit 250 is coupled to the bracket assembly 260, the first housing structure 211 and the second housing structure 212 may be assembled to each other so as to be coupled to both sides of the bracket assembly 260. As described below, the first housing structure 211 and the second housing structure 212 may be coupled to the bracket assembly 260 by being slid on both sides of the bracket assembly 260.

In one embodiment, the first housing structure 211 may include a first rotary support surface 211c, and the second housing structure 212 may include a second rotary support surface 212c corresponding to the first rotary support surface 211c. The first rotary support surface 211c and the second rotary support surface 212c may include a curved surface corresponding to the curved surface included in the hinge cover 230.

In one embodiment, when the electronic device 200 is in the flat state (e.g., state of FIG. 2A), the first rotary support surface 211c and the second rotary support surface 212c may cover the hinge cover 230 so that the hinge cover 230 may be not or minimally exposed to the rear surface of the electronic device 200. When the electronic device 200 is in the folded state (e.g., state of FIG. 2B), the first rotary support surface 211c and the second rotary support surface 212c may rotate along the curved surface included in the hinge cover 230 so that the hinge cover 230 may be maximally exposed to the rear surface of the electronic device 200.

Figure 3A:
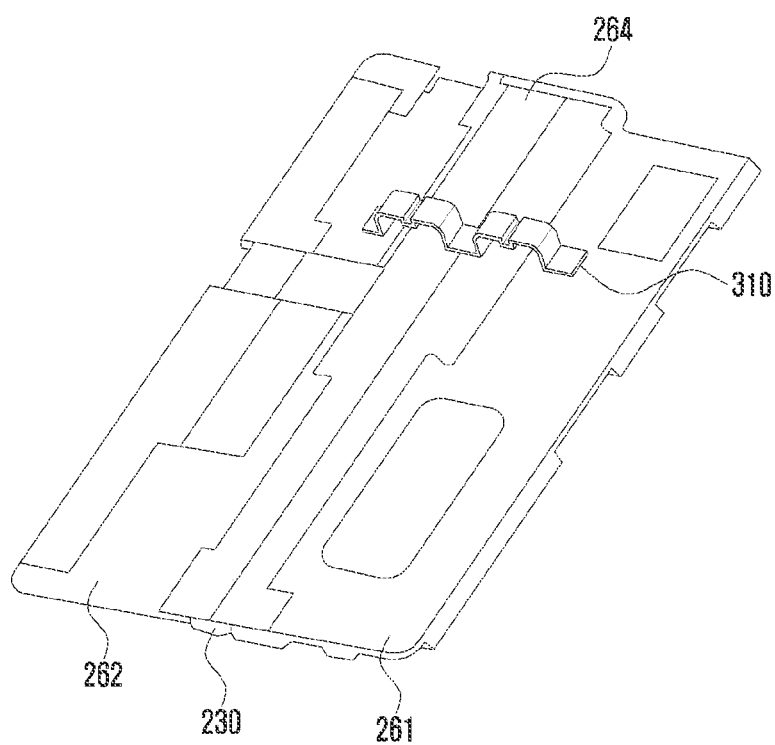
FIG. 3A is a diagram illustrating a wiring member disposed on a folding axis in an electronic device according to various embodiments.
Figure 3B:
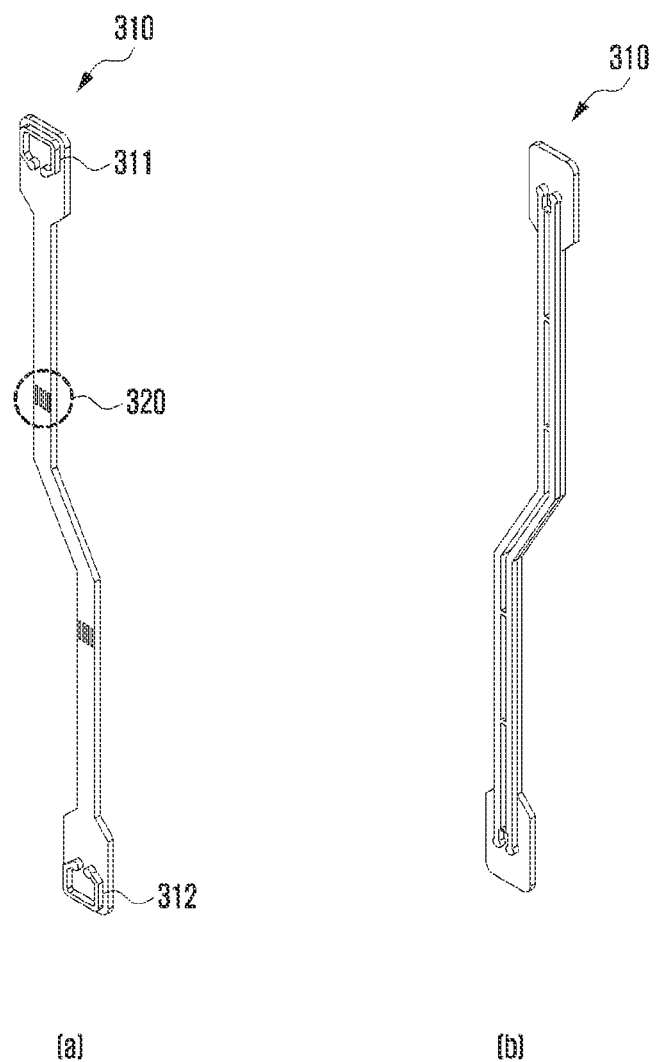
FIG. 3B is a diagram illustrating one surface and the other surface of the wiring member.
Figure 3C:
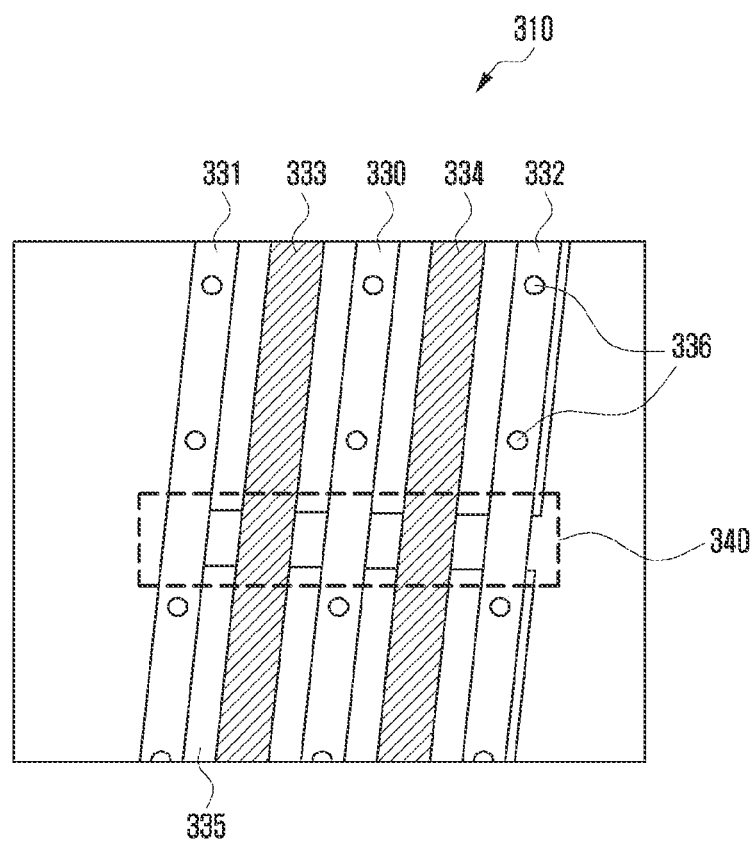
FIG. 3C is a diagram illustrating a slit structure formed corresponding to a bending area of the wiring member.

FIG. 3A is a diagram illustrating a wiring member 310 disposed on a folding axis in an electronic device according to various embodiments, FIG. 3B is a diagram illustrating one surface and the other surface of the wiring member 310, and FIG. 3C is a diagram illustrating a slit structure formed corresponding to a bending area of the wiring member 300.

Referring to FIG. 3A, the electronic device (e.g., the electronic device 101 in FIG. 1) may include at least one wiring member 310 (e.g., a flexible printed circuit board (FPCB)) for electrically connecting at least one component disposed on the first bracket 261 and at least one component disposed on the second bracket 262. The wiring member 310 may be disposed to correspond to a direction (e.g., the x-axis direction) at least partially crossing the hinge structure 264. There may be a plurality of wiring members 310, which may be disposed to at least partially cross the hinge structure 264. The wiring member 310 has a bending property, and thus can be folded or unfolded depending on a folded form of the hinge structure 264. According to an embodiment, in the electronic device 101, the first bracket 261 and the second bracket 262 may be folded symmetrically, based on the hinge structure 264 and the hinge cover 230. According to an embodiment, the wiring member 310 may be disposed in a direction (e.g., the x-axis direction) perpendicular to the folding axis (e.g., the y-axis or the folding axis (A) in FIG. 2A).

FIG. 3B is a diagram illustrating one (e.g., front) surface and the other (e.g., rear) surface of the wiring member 310. In FIG. 3B, (a) shows the front surface of the wiring member 310, and (b) shows the rear surface of the wiring member 310. The wiring member 310 may include a first connector 311 corresponding to one direction and a second connector 312 corresponding to another direction. The wiring member 310 may be a member that electrically connects the first bracket 261 and the second bracket 262 of an electronic device (e.g., the electronic device 101 in FIG. 1). For example, the first connector 311 of the wiring member 310 may be connected to a component disposed on the first bracket 261, and the second connector 312 of the wiring member 310 may be connected to a component disposed on the second bracket 262. The wiring member 310 may be a transmission path that electrically connects the first bracket 261 and the second bracket 262 and thereby transmits and receives a signal.

According to an embodiment, the wiring member 310 may include at least one slit structure 340 corresponding to a bending area 320 in which the electronic device 101 is folded.

FIG. 3C is a diagram illustrating the slit structure 340 formed corresponding to the bending area of the wiring member 310. According to an embodiment, the wiring member 310 may include one or more RF lines 333 and 334, one or more ground (GND) members 330, 331, and 332, and a tape 335. The wiring member 310 may be included in a flexible printed circuit board (FPCB), which may have a bending property. According to an embodiment, the one or more RF lines 333 and 334 and the one or more ground (GND) members 330, 331, and 332 may be formed based on a bendable material in order to have a bending property. According to an embodiment, the one or more RF lines 333 and 334 are paths of transmitting and receiving signals, and may transmit and receive signals between the first PCB and the second PCB. The one or more ground members 330, 331, and 332 may have at least one via 336 formed partially, and may perform a ground (GND) function through the via 336.

According to an embodiment, at least one of the one or more RF lines 333 and 334 and the one or more ground (GND) members 330, 331, and 332 may be attached by the adhesive member 335 (e.g., an adhesive tape).

According to various embodiments, the wiring member 310 may have the slit structure 340 formed to correspond to the folded area (e.g., a bending area). Because of the slit structure 340, the one or more RF lines 333 and 334 may be formed to have a thin thickness, and thereby durability against bending may be improved. The wiring member 310 according to various embodiments may maintain performance of the RF lines 333 and 334 related to transmission and reception of signals while improving durability against bending.

Figure 4:
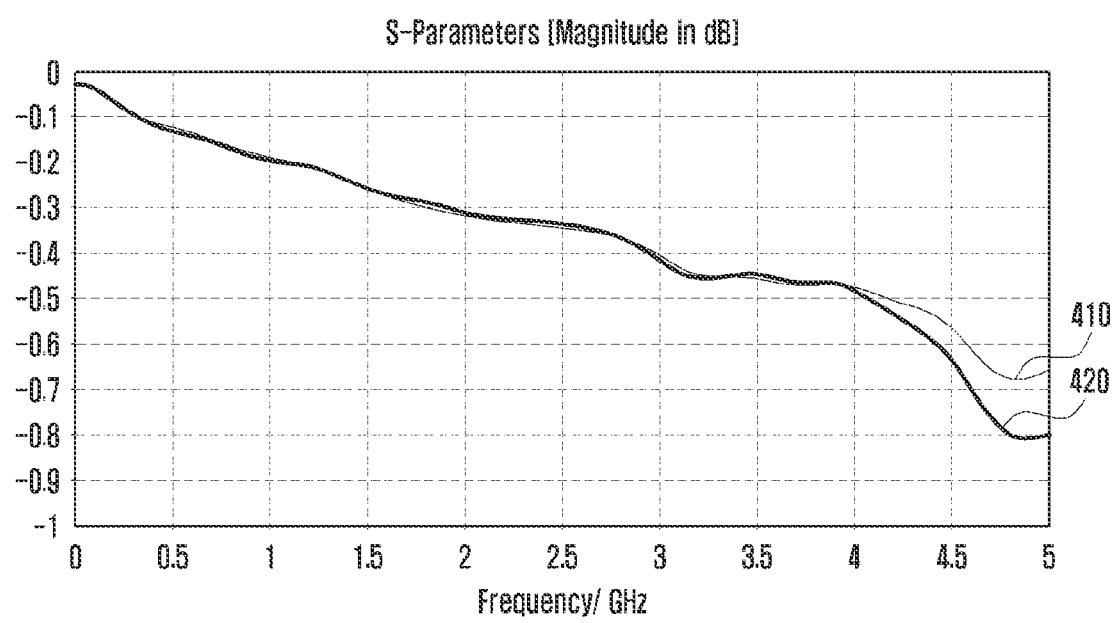
FIG. 4 is a graph showing signal transmission performance of a radio frequency transmission line having a bending property according to various embodiments.

FIG. 4 is a graph showing signal transmission performance of a radio frequency transmission line having a bending property according to various embodiments.

Referring to FIG. 4, shown are a signal transmission performance 410 based on a conventional radio frequency transmission line and a signal transmission performance 420 based on a radio frequency transmission line including a slit structure. According to an embodiment, the radio frequency transmission line (hereinafter referred to as an RF line) may have a micro strip shape implemented with two flexible copper clad laminates (FCCLs) or a strip shape implemented with three FCCLs. FIG. 4 shows the signal transmission performance 410 of the conventional RF line and the signal transmission performance 420 of the RF line including the slit structure, based on the microstrip shape RF line.

According to various embodiments, even if the RF line includes the slit structure, the signal transmission performance can be maintained.

Figure 5A:
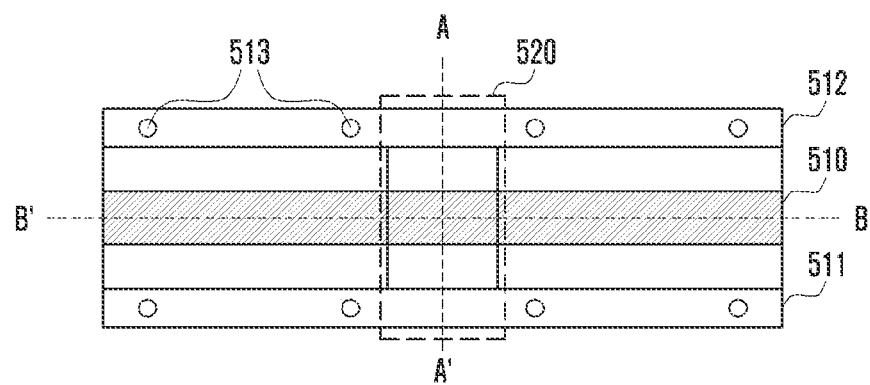
FIGS. 5A and 5B are diagrams illustrating a structure of a wiring member of a micro strip shape according to various embodiments.
Figure 5A:
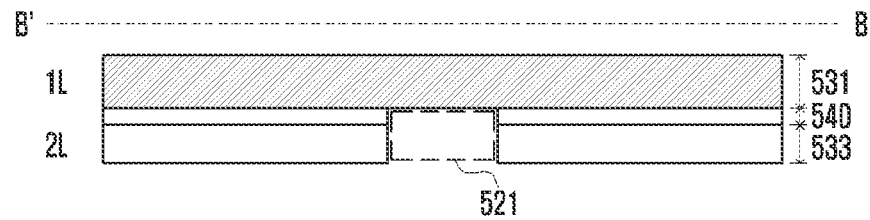
Figure 5A:
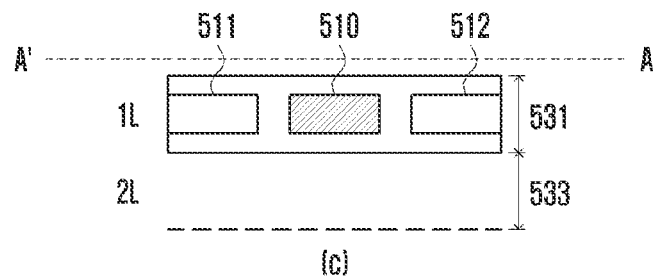
Figure 5B:
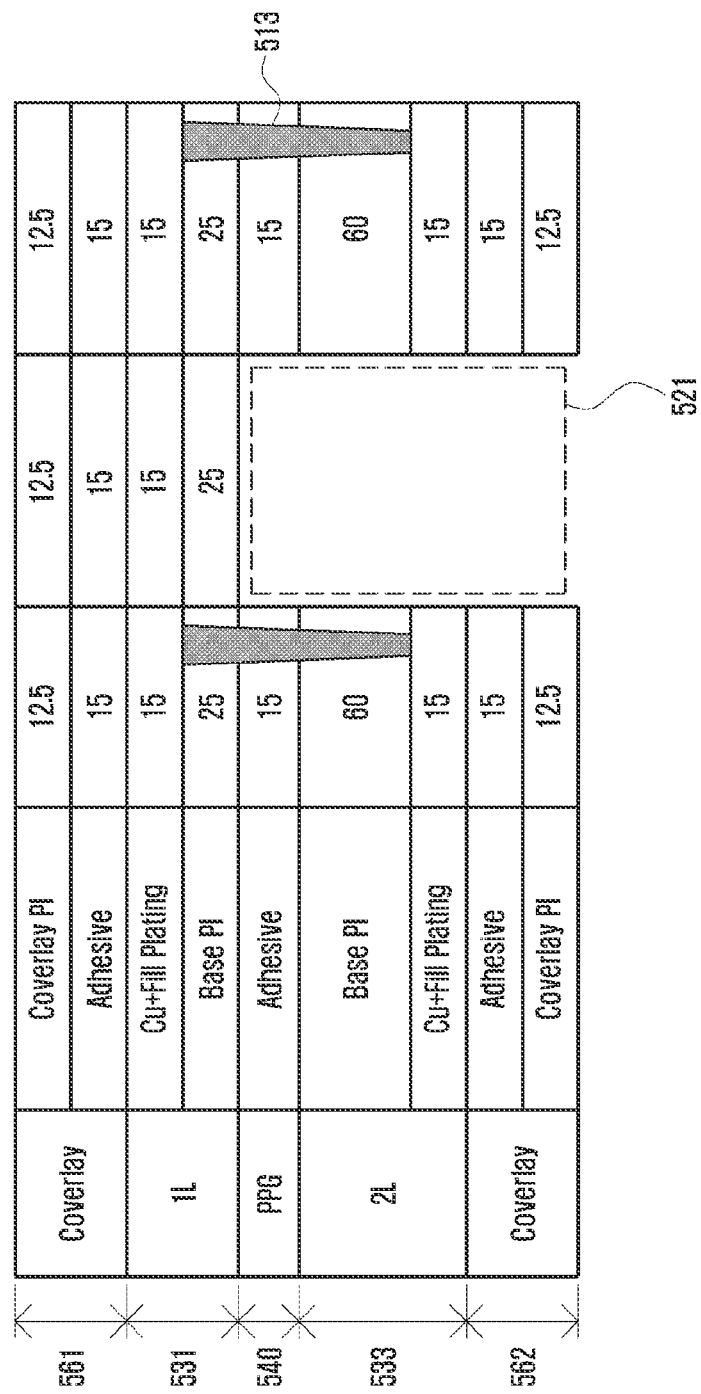

FIGS. 5A and 5B are diagrams illustrating a structure of a wiring member a micro strip shape according to various embodiments. According to an embodiment, the wiring member (e.g., the wiring member 310 in FIG. 3A) may be implemented in the micro strip shape based on two substrates (e.g., a flexible copper clad laminate (FCCL)). For example, the wiring member of the micro strip shape may be manufactured by stacking two substrates, and the two substrates may be attached using an adhesive member.

Referring to FIG. 5A, shown are a plan view (a), a side view (b), and a cross-sectional view (c) of the wiring member 310 of the micro strip shape.

Referring to the plan view (a) of the wiring member 310, two cross sections (e.g., A-A' and B-B') are shown. The side view (b) shows the wiring member 310 when cut based on the B-B' cross-section, and the cross-sectional view (c) shows the wiring member 310 when cut based on the A-A' cross-section.

Referring to the plan view (a), the wiring member 310 may include an RF line 510 (e.g., the RF lines 333 and 334 in FIG. 3C) and one or more ground members 511 and 512. One surface of the RF line 510 and the one or more ground members 511 and 512 may be at least partially attached by an adhesive member. According to an embodiment, the wiring member 310 may have a slit structure (e.g., a slit structure 521 in the side view (b) or an opening) formed at least partially corresponding to a bending area 520 where the RF line 510 is bendable. For example, the wiring member 310 of the micro strip shape may be formed by stacking two substrates, and may be formed to have a thickness corresponding to one substrate in the bending area 520. The slit structure 521 may be formed such that the wiring member 310 has a thickness corresponding to one substrate. According to an embodiment, in the wiring member 310 of the micro strip shape, two substrates are stacked, and the slit structure 521 may be processed, using a laser and a drill, to form a thickness corresponding to one substrate in the bending area 520. According to an embodiment, the wiring member 310 may be thinner in the bending area 520, and thus durability against bending may be improved. According to an embodiment, even if the thickness is reduced in the bending area 520, the signal transmission performance of the wiring member 310 may not be deteriorated. According to an embodiment, the one or more ground members 511 and 512 may have at least one via 513 formed partially, and may perform a ground (GND) function to each substrate through the via 513.

Referring to the side view (b), shown is the wiring member 310 in which two substrates (FCCLs) (e.g., a first substrate 531 and a second substrate 533) are stacked. The first substrate 531 may function as the RF line 510, and the second substrate 533 may function as a ground layer (GND). For example, the first substrate 531 may include the RF line 510. The first substrate 531 and the second substrate 533 may be stacked using an adhesive member 540. The wiring member 310 may have the slit structure 521 formed at least partially corresponding to the bending area 520 where the RF line 510 is bendable. According to an embodiment, in the bending area 520, the RF line 510 may be formed to have a thickness corresponding to one substrate. According to an embodiment, the first substrate 531 and the second substrate 533 may be connected through the at least one via 513, and the second substrate 533 may perform a ground (GND) function, based on the at least one via 513.

Referring to the cross-sectional view (c), the RF line 510 corresponding to the bending area 520 may be disposed in a central portion of the first substrate 531. The one or more ground members 511 and 512 may be disposed on both left and right sides of the first substrate 531. According to various embodiments, the wiring member 310 may be formed to have a thickness corresponding to one substrate (e.g., the thickness of the first substrate 531) in the bending area 520, and the second substrate 533 may have the slit structure 521 at least partially formed therein.

According to various embodiments, the wiring member 310 of the micro strip shape may have the slit structure 521 formed to correspond to the bending area 520. According to an embodiment, the wiring member 310 may be formed to have a thickness corresponding to one substrate (e.g., the first substrate 531) in the bending area 520. According to an embodiment, the other substrate (e.g., the second substrate 533) may be formed in a shape having the slit structure 521 corresponding to the bending area 520.

FIG. 5B is a diagram specifically showing the shape of the micro strip shape wiring member. FIG. 5B may be a view corresponding to the side view (b) of the wiring member shown in FIG. 5A.

Referring to FIG. 5B, the micro strip shape wiring member has a form in which two substrates (FCCLs) (e.g., the first substrate 531 and the second substrate 533) are stacked. The first substrate 531 includes an RF line (e.g., the RF line 510 in FIG. 5A) and may thereby function as a signal transmission line, and the second substrate 533 may function as a ground member (GND). The first and second substrates 531 and 533 may include a copper (CU)-based conductive member (CU+Fill plating) and a polyimide film (base PI). According to an embodiment, a first cover layer 561 including a polyimide film (coverlay PI) may be attached to one surface (e.g., an upper surface) of the first substrate 531, and a second cover layer 562 including a polyimide film (coverlay PI) may be attached to one surface (e.g., a lower surface) of the second substrate 533. The first cover layer 561 and the second cover layer 562 may include an adhesive member, and may be attached to the substrate by using the adhesive member.

In the electronic device 101 according to various embodiments, the RF line based on the first substrate 531 may be formed in the bending area (e.g., the bending area 520 in FIG. 5A). The thickness of the wiring member corresponding to the bending area may be about 67.5 μm corresponding to one substrate (e.g., the first substrate 531). For example, summing up all the thicknesses of the polyimide film (coverlay PI) (about 12.5 μm thick) and the adhesive member (about 15 μm thick), included in the first cover layer 561, and the copper (CU)-based conductive member (about 15 μm thick) and the polyimide film (base PI) (about 25 μm thick), included in the first substrate 531, may be about 67.5 μm. According to an embodiment, the wiring member corresponding to the bending area may be formed based on the first cover layer 561 and the first substrate 531, and may include the polyimide film (coverlay PI), the adhesive member, the copper (CU)-based conductive member, and the polyimide film (base PI).

The wiring member of the electronic device 101 according to various embodiments may be formed to have a thickness corresponding to one substrate (e.g., the first substrate 531) in the bending area 520. Even if it is formed to have a thickness corresponding to one substrate, the signal transmission performance of the wiring member can be maintained. The electronic device 101 according to various embodiments may include the wiring member formed to have a thickness corresponding to one substrate in the bending area 520 while maintaining signal transmission performance.

According to various embodiments, the second substrate 533 may have at least one via 513 (e.g., the via 513 in FIG. 5A) formed at least in part, and the first substrate 531 and the second substrate 533 may be connected through the via 513. The second substrate 533 may perform a ground (GND) function for the first substrate 531 through the via 513.

Figure 6A:
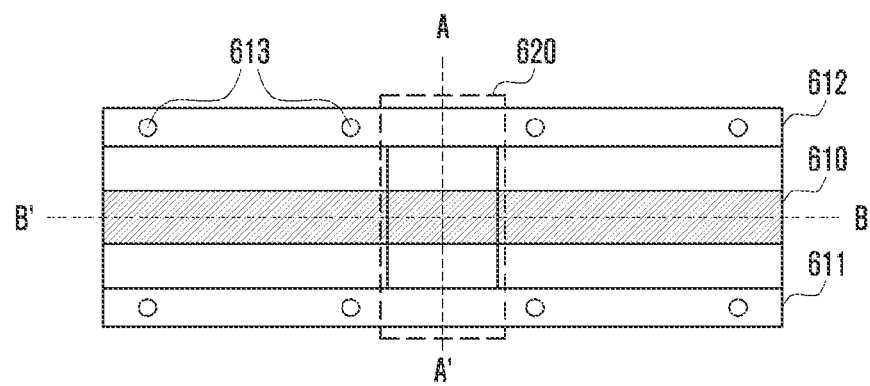
FIGS. 6A and 6B are diagrams illustrating a structure of a wiring member of a strip shape according to various embodiments.
Figure 6A:
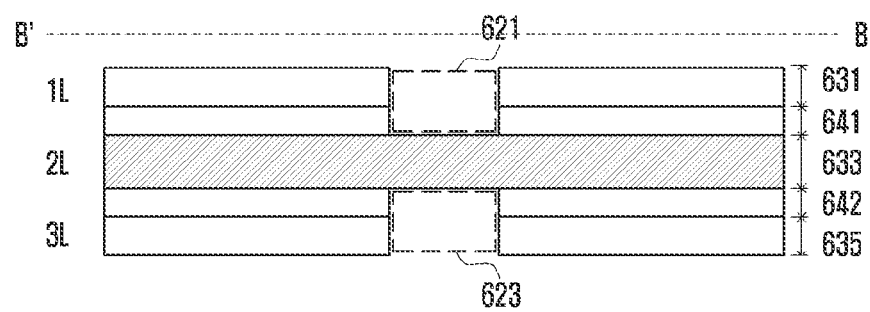
Figure 6A:
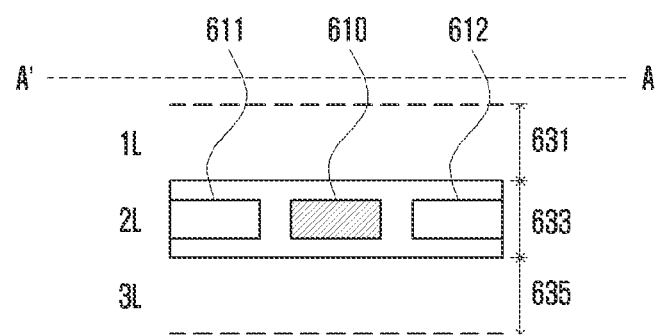
Figure 6B:
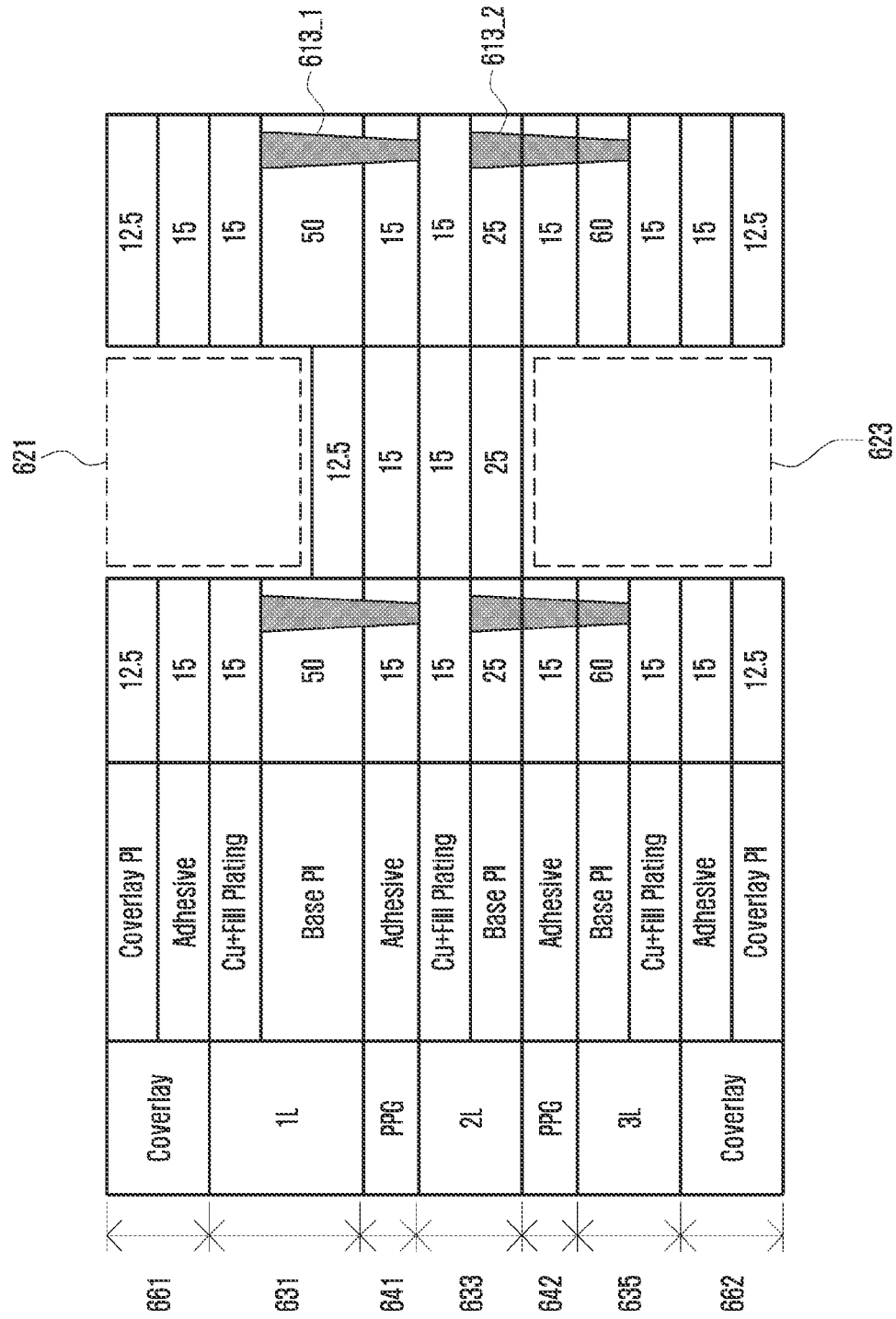

FIGS. 6A and 6B are diagrams illustrating a structure of a wiring member of a strip shape according to various embodiments. According to an embodiment, the wiring member (e.g., the wiring member 310 in FIG. 3A) may be implemented in the strip shape based on three substrates (e.g., a flexible copper clad laminate (FCCL)). For example, the wiring member of the strip shape may be manufactured by stacking three substrates, and the three substrates may be attached using an adhesive member.

Referring to FIG. 6A, shown are a plan view (a), a side view (b), and a cross-sectional view (c) of the wiring member 310 of the strip shape. Referring to the plan view (a) of the wiring member 310, two cross sections (e.g., A-A' and B-B') are shown. The side view (b) shows the wiring member 310 when cut based on the B-B' cross-section, and the cross-sectional view (c) shows the wiring member 310 when cut based on the A-A' cross-section.

Referring to the plan view (a), the wiring member 310 may include an RF line 610 (e.g., the RF lines 333 and 334 in FIG. 3C) and one or more ground members 611 and 612. One surface of the RF line 610 and the one or more ground members 611 and 612 may be at least partially attached by an adhesive member. According to an embodiment, the wiring member 310 may have a slit structure (e.g., a first slit structure 621 and a second slit structure 622 in the side view (b) or an opening) formed at least partially corresponding to a bending area 620 where the RF line 610 is bendable. For example, the wiring member 310 of the strip shape may be formed by stacking three substrates, and may be formed to have a thickness corresponding to one substrate in the bending area 620. One or more slit structures 621 and 623 may be formed such that the wiring member 310 has a thickness corresponding to one substrate. According to an embodiment, in the wiring member 310 of the strip shape, three substrates are stacked, and two slit structures (e.g., the first slit structure 621 and the second slit structure 623) may be processed, using a laser and a drill, to form a thickness corresponding to one substrate in the bending area 620. For example, three substrates may be stacked in the order of a first substrate 631, a second substrate 633, and a third substrate 635. The first slit structure 621 may be processed corresponding to the first substrate 631, and the second slit structure 623 may be processed corresponding to the third substrate 635. According to an embodiment, the wiring member 310 may be thinner in the bending area 620, and thus durability against bending may be improved. According to an embodiment, even if the thickness is reduced in the bending area 620, the signal transmission performance of the wiring member 310 may not be deteriorated. According to an embodiment, the one or more ground members 611 and 612 may have at least one via 613 formed partially, and may perform a ground (GND) function to each substrate through the via 613.

Referring to the side view (b), shown is the wiring member 310 in which three substrates (FCCLs) (e.g., the first substrate 631, the second substrate 633, and the third substrate 635) are stacked. The second substrate 633 may function as the RF line 610, and the first and third substrates 631 and 635 may function as ground layers (GND). For example, the second substrate 633 may include the RF line 610. The first substrate 631, the second substrate 633, and the third substrate 635 may be stacked using adhesive members 641 and 642. For example, the first substrate 631, the second substrate 633, and the third substrate 635 may be sequentially stacked. In this case, the first substrate 631 and the second substrate 633 may be bonded using the first adhesive member 641, and the second substrate 633 and the third substrate 635 may be bonded using the second adhesive member 642. The wiring member 310 may have two slit structures 621 and 623 formed at least partially corresponding to the bending area 620 where the RF line 610 is bendable. For example, the first slit structure 621 corresponding to the first substrate 631 and the second slit structure 623 corresponding to the third substrate 635 may be formed. According to an embodiment, in the bending area 620, the RF line 610 may be formed to have a thickness corresponding to one substrate. According to an embodiment, the first substrate 631 and the second substrate 633 may be connected through at least one via 613 (e.g., the first via), and the second substrate 633 and the third substrate 635 may be connected through at least one via 613 (e.g., the second via). According to an embodiment, the second substrate 533 may be connected to the first substrate 631 through the first via, and may perform a ground (GND) function, based on the first substrate 631. According to an embodiment, the second substrate 533 may be connected to the third substrate 635 through the second via, and may perform a ground (GND) function, based on the third substrate 635.

Referring to the cross-sectional view (c), the RF line 610 corresponding to the bending area 620 may be disposed in a central portion of the second substrate 633. The one or more ground members 611 and 612 may be disposed on both left and right sides of the second substrate 633. According to various embodiments, the wiring member 310 may be formed to have a thickness corresponding to one substrate (e.g., the thickness of the second substrate 633) in the bending area 620, and each of the first and third substrates 631 and 635 may have the slit structure (e.g., the first slit structure 621 and the second slit structure 623) at least partially formed therein. For example, the first substrate 631 may have the first slit structure 621 at least partially formed, and the third substrate 635 may have the second slit structure 623 at least partially formed.

According to various embodiments, the wiring member 310 of the strip shape may have two slit structures (e.g., the first slit structure 621 and the second slit structure 623) formed to correspond to the bending area 620. According to an embodiment, the wiring member 310 may be formed to have a thickness corresponding to one substrate (e.g., the second substrate 633) in the bending area 620. According to an embodiment, the first and third substrates 631 and 635 may be formed in a shape having at least one slit structure (e.g., the first slit structure 621 and the second slit structure 623) corresponding to the bending area 620.

FIG. 6B is a diagram specifically showing the shape of the strip shape wiring member. FIG. 6B may be a view corresponding to the side view (b) of the wiring member shown in FIG. 6A.

Referring to FIG. 6B, the strip shape wiring member has a form in which three substrates (e.g., the first substrate 631, the second substrate 633, and the third substrate 635) are stacked. The first and third substrates 631 and 635 may function as ground members, and the second substrate 531 including an RF line (e.g., the RF line 610 in FIG. 6A) may function as a signal transmission line. The first, second, and third substrates 631, 633, and 635 may include a copper (CU)-based conductive member (CU+Fill plating) and a polyimide film (base PI). According to an embodiment, a first cover layer 661 including a polyimide film (coverlay PI) may be attached to one surface (e.g., an upper surface) of the first substrate 631, and a second cover layer 662 including a polyimide film (coverlay PI) may be attached to one surface (e.g., a lower surface) of the third substrate 635. The first cover layer 661 and the second cover layer 662 may include an adhesive member, and may be attached to the substrate by using the adhesive member.

In the electronic device 101 according to various embodiments, the RF line based on the second substrate 633 may be formed in the bending area (e.g., the bending area 620 in FIG. 6A). The thickness of the wiring member corresponding to the bending area may be about 67.5 μm corresponding to one substrate (e.g., the second substrate 633). For example, summing up all the thicknesses of the copper (CU)-based conductive member (about 15 μm thick) and the polyimide film (base PI) (about 25 μm thick), included in the second substrate 633, the adhesive member (about 15 μm thick) between the first and second substrates 631 and 633, and the polyimide film (coverlay PI) (about 12.5 μm thick), included in the first cover layer 661, and may be about 67.5 μm. According to an embodiment, the wiring member corresponding to the bending area may be formed based on the second substrate 633, and may include the copper (CU)-based conductive member and the polyimide film (base PI), included in the second substrate 633, the adhesive member between the first substrate 631 and the second substrate 633, and the polyimide film (base PI) included in the first substrate 631.

The wiring member of the electronic device 101 according to various embodiments may be formed to have a thickness corresponding to one substrate (e.g., the second substrate 633) in the bending area 620. According to various embodiments, the first substrate 631 corresponding to the bending area 620 may include the first slit structure 621, and the third substrate 635 corresponding to the bending area 620 may include the second slit structure 623. Even if the wiring member is formed to have a thickness corresponding to one substrate in the bending area 620, the signal transmission performance of the wiring member can be maintained. The electronic device 101 according to various embodiments may include the wiring member formed to have a thickness corresponding to one substrate in the bending area 620 while maintaining signal transmission performance.

According to various embodiments, at least one first via 613_1 (e.g., the via 613 in FIG. 6A) may be formed between the first substrate 631 and the second substrate 633, and the first and second substrates 631 and 633 may be connected through the first via 613_1. The second substrate 633 may perform a ground (GND) function for the first substrate 631 through the first via 613_1. According to various embodiments, at least one second via 6132 (e.g., the via 613 in FIG. 6A) may be formed between the second substrate 633 and the third substrate 635, and the second and third substrates 633 and 635 may be connected through the second via 613_2. The second substrate 633 may perform a ground (GND) function for the third substrate 635 through the second via 613_2.

An electronic device according to various embodiments of the disclosure may include a first housing (e.g., the first bracket 261 in FIG. 2C), a hinge part (e.g., the hinge structure 264 in FIG. 2C) having a first surface connected to the first housing 261, a second housing (e.g., the second bracket 262 in FIG. 2C) connected to a second surface of the hinge part 264 opposite to the first surface, and a wiring member (e.g., the wiring member 310 in FIG. 3) electrically connecting the first housing 261 and the second housing 262. The wiring member 310 may be folded or unfolded based on the hinge part 264, and may have a slit (e.g., the slit structure 521 in FIG. 5B) formed to correspond to at least a portion of the folded or unfolded bending area (e.g., the bending area 520 in FIG. 5A).

According to various embodiment, the wiring member 310 may be formed based on a flexible printed circuit board (FPCB) which is bendable.

According to various embodiment, the wiring member 310 may include a micro strip shape wiring member formed based on two substrates (e.g., the first substrate 531 and the second substrate 533 in FIG. 5B) and a strip shape wiring member formed based on three substrates (e.g., the first substrate 631, the second substrate 633, and the third substrate 635 in FIG. 6B).

According to various embodiment, the micro strip shape wiring member may be formed based on a first substrate 531 and a second substrate 533, and the first substrate 531 and the second substrate 533 may be stacked.

According to various embodiment, the micro strip shape wiring member may include at least one radio frequency transmission line (RF line) 510 formed corresponding to the first substrate 531, and a slit 521 formed corresponding to the second substrate 533.

According to various embodiment, the slit 521 may be formed to correspond to the bending area 520 in which the wiring member is folded or unfolded.

According to various embodiment, the slit 521 may be formed by additional processing corresponding to the second substrate 533 in a state in which the first substrate 531 and the second substrate 533 are stacked.

According to various embodiment, the micro strip shape wiring member may include at least one radio frequency transmission line 510 formed based on the first substrate 531 to correspond to the bending area, and a thickness of the wiring member corresponding to the bending area 520 may be determined corresponding to the first substrate 531.

According to various embodiment, the first substrate 531 and the second substrate 533 may be formed based on a copper (CU)-based conductive member (CU+Fill plating) and a polyimide film (PI).

According to various embodiment, the strip shape wiring member may be formed based on a first substrate 631, a second substrate 633, and a third substrate 635, and the first substrate 631, the second substrate 633, and the third substrate 635 may be stacked in order.

According to various embodiment, the strip shape wiring member may include at least one radio frequency transmission line (RF line) 610 formed corresponding to the second substrate 633, a first slit 621 formed corresponding to the first substrate 631, and a second slit 623 formed corresponding to the third substrate 635.

According to various embodiment, the first and second slits 621 and 623 may be formed to correspond to the bending area 620 in which the wiring member is folded or unfolded.

According to various embodiment, in a state in which the first substrate 631, the second substrate 633, and the third substrate 635 are stacked, the first slit 621 may be formed by additional processing corresponding to the first substrate 631, and the second slit 623 may be formed by additional processing corresponding to the third substrate 635.

According to various embodiment, the strip shape wiring member may include at least one radio frequency transmission line 610 formed based on the second substrate 633 to correspond to the bending area 620, and a thickness of the wiring member corresponding to the bending area 620 may be determined corresponding to the second substrate 633.

According to various embodiment, the first substrate, the second substrate, and the third substrate may be formed based on a copper (CU)-based conductive member (CU+Fill plating) and a polyimide film (PI).

The invention claimed is:

1. An electronic device comprising:
   a first housing;
   a hinge part having a first surface connected to the first housing;
   a second housing connected to a second surface of the hinge part opposite to the first surface; and
   a wiring member electrically connecting the first housing and the second housing,
   wherein the wiring member is folded or unfolded based on the hinge part,
   wherein the wiring member is formed based on a first substrate, a second substrate, and a third substrate,
   wherein the first substrate, the second substrate, and the third substrate being stacked in order,
   wherein the second substrate includes a radio frequency transmission line (RF line), and the first substrate includes a first slit, and the third substrate includes a second slit, and
   wherein the first slit and the second slit are formed based on a bending area in which the wiring member is folded or unfolded.

2. The electronic device of claim 1, wherein the wiring member is formed based on a flexible printed circuit board (FPCB) which is bendable.

3. The electronic device of claim 1, wherein the wiring member includes one of a micro strip shape wiring member formed based on two substrates or a strip shape wiring member formed based on three substrates.

4. The electronic device of claim 3,
   wherein the micro strip shape wiring member is formed based on the first substrate and the second substrate,
   wherein the first substrate and the second substrate are stacked, and
   wherein the first substrate and the second substrate are formed based on a copper (CU)-based conductive member (CU+Fill plating) and a polyimide film (PI).

5. The electronic device of claim 4, wherein the micro strip shape wiring member includes at least one radio frequency transmission line (RF line) formed corresponding to the first substrate, and a slit formed corresponding to the second substrate.

6. The electronic device of claim 5, wherein the slit is formed to correspond to the bending area in which the wiring member is folded or unfolded, and wherein the slit is formed by additional processing corresponding to the second substrate in a state in which the first substrate and the second substrate are stacked.

7. The electronic device of claim 4, wherein the micro strip shape wiring member includes at least one radio frequency transmission line formed based on the first substrate to correspond to the bending area, and a thickness of the wiring member corresponding to the bending area is determined corresponding to the first substrate.

8. The electronic device of claim 3, wherein the strip shape wiring member is formed based on the first substrate, the second substrate, and the third substrate, and
wherein the first substrate, the second substrate, and the third substrate are formed based on a copper (CU)-based conductive member (CU+Fill plating) and a polyimide film (PI).

9. The electronic device of claim 8, wherein in a state in which the first substrate, the second substrate, and the third substrate are stacked, the first slit is formed by additional processing corresponding to the first substrate, and the second slit is formed by additional processing corresponding to the third substrate.

10. The electronic device of claim 8, wherein the strip shape wiring member includes at least one radio frequency transmission line formed based on the second substrate to correspond to the bending area, and a thickness of the wiring member corresponding to the bending area is determined corresponding to the second substrate.

11. A bendable wiring member comprising:
a first substrate;
a second substrate stacked on a first surface of the first substrate; and
a third substrate stacked on a second surface of the first substrate opposite to the first surface,
wherein the second substrate includes a radio frequency transmission line, and the first substrate includes a first slit, and the third substrate includes a second slit, and
wherein the first slit and the second slit are formed based on a bending area in which the wiring member is folded or unfolded.

12. The wiring member of claim 11,
wherein the first substrate, the second substrate, and the third substrate are formed based on a copper (CU)-based conductive member (CU+Fill plating) and a polyimide film (PI).

13. The wiring member of claim 12, wherein a thickness of the wiring member corresponding to the bending area is determined corresponding to a thickness of the first substrate.

14. The wiring member of claim 12, wherein the first slit and the second slit are formed by additional processing in a state in which at least some of the first substrate, the second substrate, and the third substrate are stacked.

* * * * *